(12) United States Patent
Uttarwar et al.

(10) Patent No.: US 9,530,491 B1
(45) Date of Patent: Dec. 27, 2016

(54) SYSTEM AND METHOD FOR DIRECT WRITE TO MLC MEMORY

(71) Applicant: SanDisk Technologies Inc., Plano, TX (US)

(72) Inventors: Sagar Uttarwar, Maharashtra (IN); Dinesh Agarwal, Bangalore (IN); Prasun Ratn, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/942,456

(22) Filed: Nov. 16, 2015

(51) Int. Cl.
*G11C 11/34* (2006.01)
*G11C 11/56* (2006.01)
*G11C 16/10* (2006.01)

(52) U.S. Cl.
CPC .......... *G11C 11/5628* (2013.01); *G11C 16/10* (2013.01)

(58) Field of Classification Search
CPC .................................................. G11C 11/5628
USPC ............... 365/185.12, 185.03, 238.5, 189.05
See application file for complete search history.

(56) References Cited

U.S. PATENT DOCUMENTS

| | | | | |
|---|---|---|---|---|
| 7,962,685 B2 * | 6/2011 | Cheung | ............... | G06F 12/0246 711/103 |
| 8,812,771 B2 * | 8/2014 | Yim | .............................. | 710/52 |
| 8,886,877 B1 * | 11/2014 | Avila | .................... | G06F 3/0679 711/103 |
| 2008/0172520 A1 * | 7/2008 | Lee | ...................... | G11C 11/5628 711/103 |
| 2009/0327591 A1 * | 12/2009 | Moshayedi | ......... | G06F 11/1441 711/103 |
| 2010/0042773 A1 * | 2/2010 | Yeh | ..................... | G06F 12/0804 711/103 |
| 2010/0318839 A1 * | 12/2010 | Avila | ................... | G06F 12/0802 714/5.11 |
| 2011/0208896 A1 * | 8/2011 | Wakrat | ................ | G06F 12/0246 711/103 |
| 2012/0167100 A1 * | 6/2012 | Li | .......................... | G11C 16/26 718/102 |
| 2013/0322169 A1 * | 12/2013 | Goss | ..................... | G11C 16/22 365/185.02 |
| 2014/0053041 A1 * | 2/2014 | Sakaue | ............. | H03M 13/2909 714/758 |
| 2014/0244903 A1 * | 8/2014 | Yano | .................... | G06F 12/0246 711/103 |
| 2015/0012684 A1 * | 1/2015 | Avila | .................... | G06F 3/0688 711/103 |

\* cited by examiner

*Primary Examiner* — Viet Q Nguyen
(74) *Attorney, Agent, or Firm* — Brinks Gilson & Lione

(57) ABSTRACT

Apparatus and method for writing data directly to multi-level cell (MLC) memory without folding or transferring of the data from single-level cell (SLC) memory to MLC memory are disclosed. A memory device, which includes the SLC memory and MLC memory, receives data from a host device. The memory device programs the data (such as the lower/middle/upper pages) from volatile memory into MLC memory, without transferring data from SLC memory. The memory device also stores part of the data (such as the lower/middle pages) in SLC memory as a backup in case of error. In particular, if the data is not properly programmed into the MLC memory, the data in SLC memory is used to program the data a second time into the MLC memory.

21 Claims, 9 Drawing Sheets

SYSTEM AND METHOD FOR DIRECT WRITE TO MLC MEMORY

TECHNICAL FIELD

This application relates generally to memory devices. More specifically, this application relates to writing directly to multi-level cell (MLC) memory without reading data from single-level cell (SLC) memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A memory device may comprise a memory device controller and memory. The memory may be composed of different types of memory, such as volatile memory (e.g., random access memory) and non-volatile memory (e.g., NAND flash memory). In particular, the non-volatile memory may be composed of memory cells that can be programmed to store a single bit or a single level, being termed a single-level cell (SLC) whereas other memory cells may be programmed to store multiple bits or multiple levels, being termed multi-level cells.

When the memory device receives data from a host device, the memory device may first program the data into volatile memory (e.g., a RAM portion assigned for use by the memory device controller). Then, the memory device controller may program the data from volatile memory into SLC memory. Subsequently, the data stored in SLC memory may be moved or copied to MLC memory. For example, data stored in one or more of the SLC pages (or blocks) may be folded to one or more of the MLC pages (or blocks). As an example, where an MLC stores three bits per cell (e.g., X3), data stored in three SLC pages may be copied to a single MLC page. More particularly, an MLC page may store data from three SLC pages, where the data is stored in upper, middle, and lower pages of the MLC page. Thus, the moving or copying of data from SLC memory to MLC memory (or from one or more SLC pages (or blocks) to one or more MLC pages (or blocks)) may be referred to as a folding operation.

BRIEF DESCRIPTION OF THE DRAWINGS

The system may be better understood with reference to the following drawings and description. In the figures, like reference numerals designate corresponding parts throughout the different views.

DETAILED DESCRIPTION

Figure 1A:
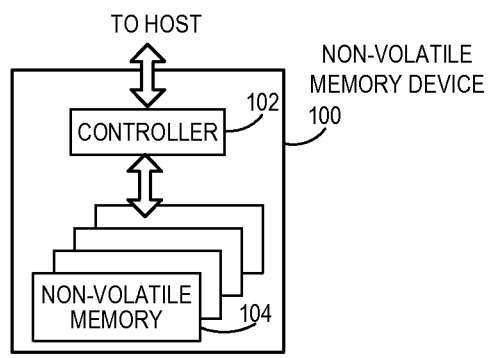
FIG. 1A is a block diagram of an example non-volatile memory device.

A memory device may include a memory device controller and memory. The memory may, in one embodiment, be in the form of one or more memory integrated circuit chips. The memory device may receive data from a host device, instructing the memory device to store the data in the memory. In response thereto, the memory device controller may send one or more commands to the memory integrated circuit chip(s) in order for the data to be written into the memory.

As discussed in more detail below, the memory may comprise volatile memory and non-volatile memory. The non-volatile memory may comprise non-volatile memory cells in which the data may be stored. The non-volatile memory cells can take the form of solid-state (e.g., flash) memory cells and can be one-time programmable, few-time programmable, or many-time programmable. Further, the non-volatile memory cells may be programmed to store a single level (e.g., a logic "0" or a logic "1"), termed single-level cells (SLC). Alternatively, the non-volatile memory cells may be programmed to store more than a single level (e.g., a logic "00", a logic "01", a logic "10", or a logic "11"), termed multi-level cells (MLC). Examples of MLC include double-level cells (DLC), triple-level cells (TLC), quadruple-level cells (QLC), etc.

When writing data to the non-volatile memory, the data may first be stored in SLC and then folded into MLC. For example, the folding process may comprise performing an on-chip copy of data from three SLC blocks to one destination MLC block whereby the transfer of data from the 1 bit (2 states) per cell of the SLC blocks to the higher density 3 bit (8 states) per cell arrangement of the destination MLC block. As is generally understood, binary flash memory cells can have two possible states (0 or 1) that represent 1 bit of information. For a given total operating voltage range available in a cell, the states of a binary cell can be represented by voltage levels above or below a reference voltage set halfway between the maximum and minimum voltage of the range. MLC memory cells, which may have the same physical configuration as a binary cell, need to partition their operating voltage range into finer increments to allow for discernable peaks at each desired state. For a three bit per cell MLC arrangement, a distribution of detectable eight states (000, 001, 010, 011, 100, 101, 110, 111) is fit into the same voltage range that the binary memory cell can use for just two states.

However, during a folding operation where data stored in one or more source SLC blocks is to be copied to a destination MLC block, an error event may occur that result in only some of the data being successfully written to the destination MLC block. An example error event may include a power cycle (shutdown) or write abort event, which may cause the copying of the data to the destination MLC block to end or be aborted prematurely before all of the data is copied. Another example error event may include a program failure, where even though all of the data may be copied to the destination MLC block, some of the data may be incorrectly programmed into the destination MLC block. Other error events or combinations of error events resulting in only some of the data being correctly written to the destination MLC block may be possible.

In one embodiment, rather than folding data from SLC to MLC, the host data may be written to MLC without folding or transferring of the data from SLC to MLC. As discussed in more detail below, writing to MLC may be performed by writing (e.g., folding) the data from volatile memory to MLC without the data being transferred from SLC to MLC. The direct writing (e.g., without transfer of data from SLC to MLC) may reduce write amplification and may be quicker than folding of data from SLC to MLC. However, if an error event occurs (such as any error event disclosed above) when writing to MLC, the host data may be lost. In particular, when receiving the host data, the memory device may periodically acknowledge receipt of the host data. In the event that a power cycling error occurs before the write to MLC completes, the host data that has already been acknowledged may be lost.

In order to perform a write to MLC without folding or transfer of data from SLC to MLC, in one embodiment, part or all of the host data written directly to MLC may likewise be written to SLC. In this way, in the event that an error event occurs when writing to MLC, the memory device may use the data written in SLC to fold into MLC. Thus, in one embodiment, unless there is an error event, the MLC is written without folding from SLC. Further, in the event of an error occurs, the data may be folded from SLC into MLC.

In a more specific embodiment, less than all of the host data (but not all of the host data) that is written directly to MLC is likewise written to SLC. For example, TLC may program a lower page, a middle page, and an upper page of data, as discussed in more detail below. Further, SLC may be programmed with the lower page and the middle page of data. In response to writing the data to SLC (in the example given, the lower page and middle page of data to SLC), the memory device may send an acknowledgement to the host for the host data already written to SLC. In this way, in response to an error event in the MLC program (e.g., programming the lower page, middle page, and upper page), the memory device may request the host to resend the unacknowledged data (e.g., a remainder of the data non acknowledged, such as the upper page of data) and may access SLC for the stored data (e.g., the stored lower page and middle page of data). Thus, even in the event of an error, the data may be recovered and programmed to MLC.

To program MLC, one or more volatile memories may be used. In the example of TLC, lower page latches, middle page latches and upper page latches may be used. In practice, the programming of MLC is by writing the data from the lower/middle/upper page latches into the MLC lower/middle/upper pages. In one embodiment, the programming of SLC may be performed at least partly simultaneously when transferring the data into the volatile memory used to program the MLC. For example, in TLC, the lower page of data is programmed to SLC. Likewise, the lower page of data is latched into the lower page latches. The programming of the lower page of data into SLC is performed at least partly simultaneously as when the lower page of data is latched into the lower page latches. Because of the simultaneous (or at least partly simultaneous) programming, the programming of the SLC does not delay (or delays less) the programming of MLC.

In an alternate embodiment, the SLC may be programmed at a different time (e.g., either before or after) than the data is programmed into the volatile memory used to program the MLC. For example, in TLC, the middle page of data is programmed to SLC. Likewise, the middle page of data is latched into the middle page latches. The programming of the lower page of data into SLC is performed at a different time (e.g., before) the latching of the middle page of data into the middle page latches. In still an alternate embodiment, part of the data programmed in the SLC is at the same time as the data is programmed into the volatile memory used to program the MLC, and another part of the data programmed in the SLC is a different time (e.g., either before or after) than the data is programmed into the volatile memory used to program the MLC.

Thus, in one embodiment, the memory device may program the data (such as the lower/middle/upper pages) from volatile memory into MLC memory, without transferring the data from SLC memory. In one embodiment, the memory device may also store only part of the data (such as the lower/middle pages) in SLC memory as a backup in case of error. In particular, if the data is not properly programmed into the MLC memory, the data in SLC memory is used to program the data a second time into the MLC memory.

Referring to the figures, FIG. 1A is a block diagram illustrating a non-volatile memory device. The non-volatile memory device 100 includes a controller 102 and non-volatile memory that may be composed of one or more non-volatile memory die 104. The non-volatile memory die may comprise one or more memory integrated circuit chips. One or both of the controller 102 and non-volatile memory die 104 may use a regulated voltage. As used herein, the term die refers to the set of non-volatile memory cells, and associated circuitry for managing the physical operation of those non-volatile memory cells, that are formed on a single semiconductor substrate. Controller 102 interfaces with a host device and transmits command sequences for read, program (e.g., write), and erase operations to non-volatile memory die 104.

The controller 102 can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. These examples of the controller 102 are not exhaustive and other forms for performing controller functionality are contemplated. The controller 102 can be configured with hardware and/or firmware to perform the various functions described below and shown in the flow diagrams. For example, the hardware and/or firmware may be configured for analysis as to whether to save the value of the read counter to non-volatile memory, as discussed in more detail below. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

One type of controller 102 is a flash memory controller. As used herein, a flash memory controller is a device that manages data stored on flash memory and communicates with a host device, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host device needs to read data from or write data to the flash memory, it will communicate with the flash memory controller. If the host device provides a logical address to which data is to be read/written, the flash memory controller can convert the logical address received from the host device to a physical address in the flash memory. (Alternatively, the host device can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. One example of non-volatile memory die 104 may comprise a memory integrated circuit chip. The memory cells can take the form of solid-state (e.g., flash) memory cells and can be one-time programmable, few-time programmable, or many-time programmable. As discussed above, the memory cells can also be single-level cells (SLC), double-level cells (DLC), triple-level cells (TLC), quadruple-level cells (QLC), or use other memory cell level technologies, now known or later developed. Thus, any cell that may store more than a single level may be known as multi-level cells (MLC). Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory device 100 may be a card based system, such as a secure digital (SD) or a micro secure digital (micro-SD) card. In an alternate embodiment, memory device 100 may be part of an embedded memory system.

Although in the example illustrated in FIG. 1A non-volatile memory device 100 includes a single channel between controller 102 and non-volatile memory die 104, the subject matter described herein is not limited to having a single memory channel. For example, in some NAND memory system architectures such as illustrated in FIGS. 1B-C, 2, 4, 8 or more NAND channels may exist between the controller and the NAND memory system, depending on controller capabilities. In any of the embodiments described herein, more than a single channel may exist between the controller and the memory die, even if a single channel is shown in the drawings.

Figure 1B:
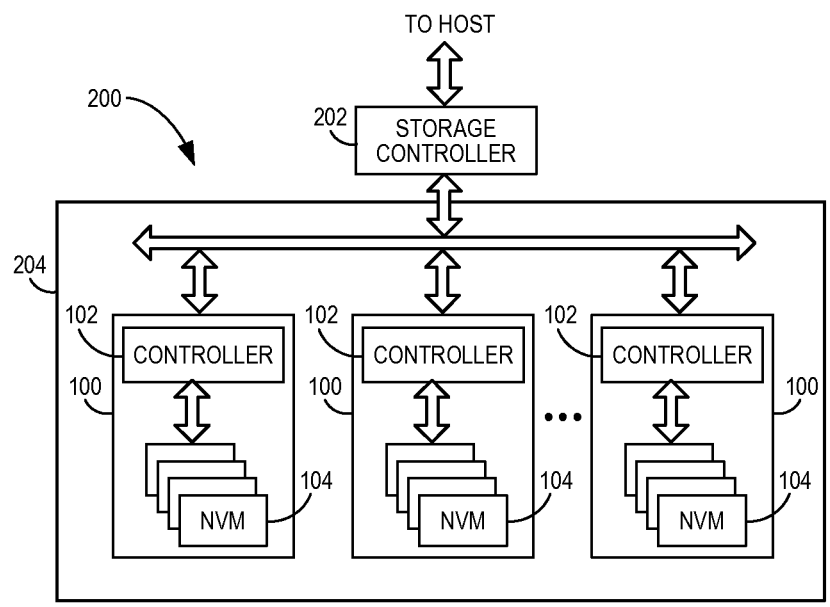
FIG. 1B is a block diagram illustrating an exemplary storage circuitry.

FIG. 1B illustrates storage circuitry 200 that includes plural non-volatile memory devices 100. As such, storage circuitry 200 may include a storage controller 202 that interfaces with a host device and with storage system 204, which includes a plurality of non-volatile memory devices 100. The interface between storage controller 202 and non-volatile memory devices 100 may be a bus interface, such as a serial advanced technology attachment (SATA) or peripheral component interface express (PCIe) interface. Storage circuitry 200, in one embodiment, may be a solid state drive (SSD), such as found in portable computing devices, such as laptop computers, and tablet computers.

Figure 1C:
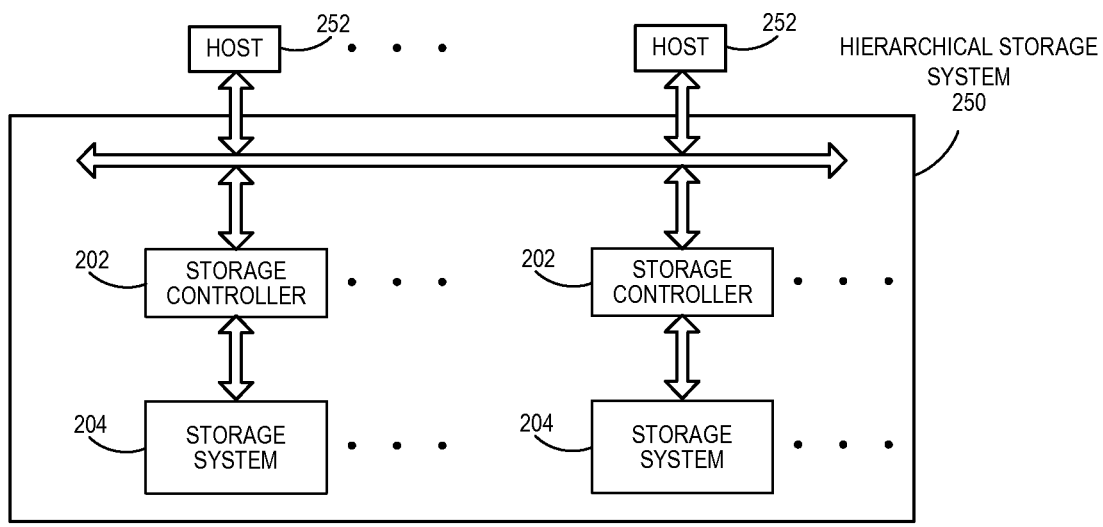
FIG. 1C is a block diagram illustrating a hierarchical storage system.

FIG. 1C is a block diagram illustrating a hierarchical storage system. A hierarchical storage system 250 includes a plurality of storage controllers 202, each of which controls a respective storage system 204. Host systems 252 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
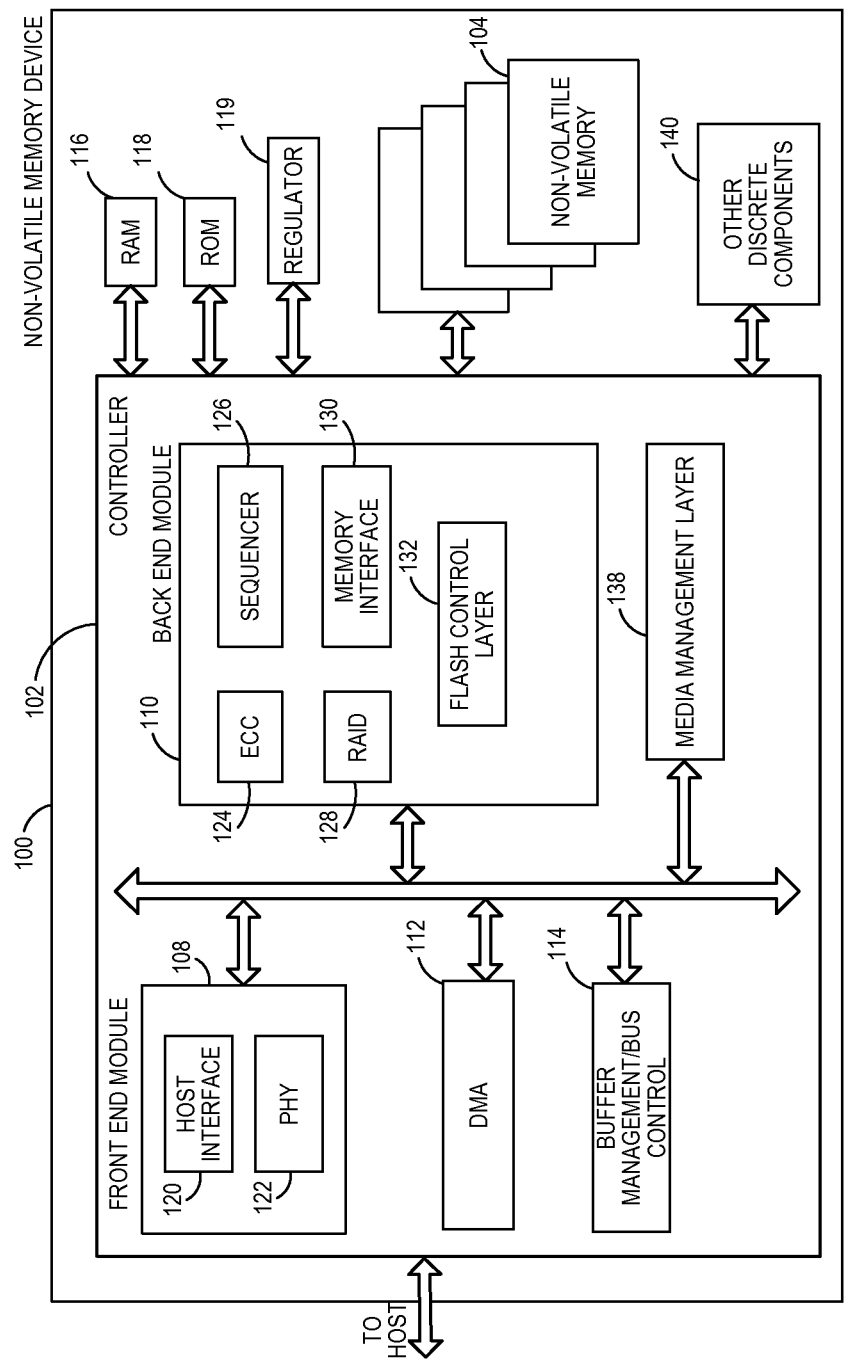
FIG. 2A is a block diagram illustrating exemplary components of a controller of a non-volatile memory device.

FIG. 2A is a block diagram illustrating exemplary components of controller 102 in more detail. Controller 102 includes front end circuitry 108 that interfaces with a host device, back end circuitry 110 that interfaces with the one or more non-volatile memory die 104, and various other circuitry that perform functions which will now be described in detail.

Circuitry of the controller 102 may include direct memory access (DMA) 112. In one embodiment, DMA 112 may be a part of controller 102, as illustrated in FIG. 2A. In an alternate embodiment, DMA 112 may be separate from controller 102. Regardless, DMA 112 may be used to control the movement of data amongst different sections of memory. For example, DMA 112 may be used to control the movement of data between a RAM (such as buffer RAM) and one or more latches (such as main latch), discussed in more detail below. Further, DMA 112 may, in one embodiment, comprises flash DMA (FDMA), used to manage movement of data within a flash memory device.

Referring again to circuitry of the controller 102, a buffer manager/bus controller 114 manages buffers in random access memory (RAM) 116 and controls the internal bus arbitration of controller 102. For example, one use of RAM 116 is buffer RAM, in which the buffer manager/bus controller 114 may use RAM 116 to buffer host data received from the host device. As discussed in more detail below, DMA 112 may control the flow of data from RAM 116 to one or more parts on memory, such as main latch 158, discussed in more detail below. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end circuitry 108 includes a host interface 120 and a physical layer interface (PHY) 122 that provide the electrical interface with the host device or next level storage controller. The choice of the type of host interface 120 can depend on the type of memory being used. Examples of host interfaces 120 include, but are not limited to, SATA, SATA Express, SAS, Fibre Channel, USB, PCIe, eMMC I/F, and NVMe. The host interface 120 typically facilitates transfer for data, control signals, and timing signals.

Back end circuitry 110 includes an error correction controller (ECC) engine 124 that encodes the data bytes received from the host device, and decodes and error corrects the data bytes read from the non-volatile memory. A command sequencer 126 generates command sequences, such as program and erase command sequences, to be transmitted to non-volatile memory die 104. RAID (Redundant Array of Independent Drives) circuitry 128 manages generation of RAID parity and recovery of failed data. The RAID parity may be used as an additional level of integrity protection for the data being written into the non-volatile memory device 100. In some cases, the RAID circuitry 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end circuitry 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102.

In alternative embodiments, one or more of the physical layer interface 122, RAID circuitry 128, media management layer 138 and buffer management/bus controller 114 are optional components that are not necessary in the controller 102.

Figure 2B:
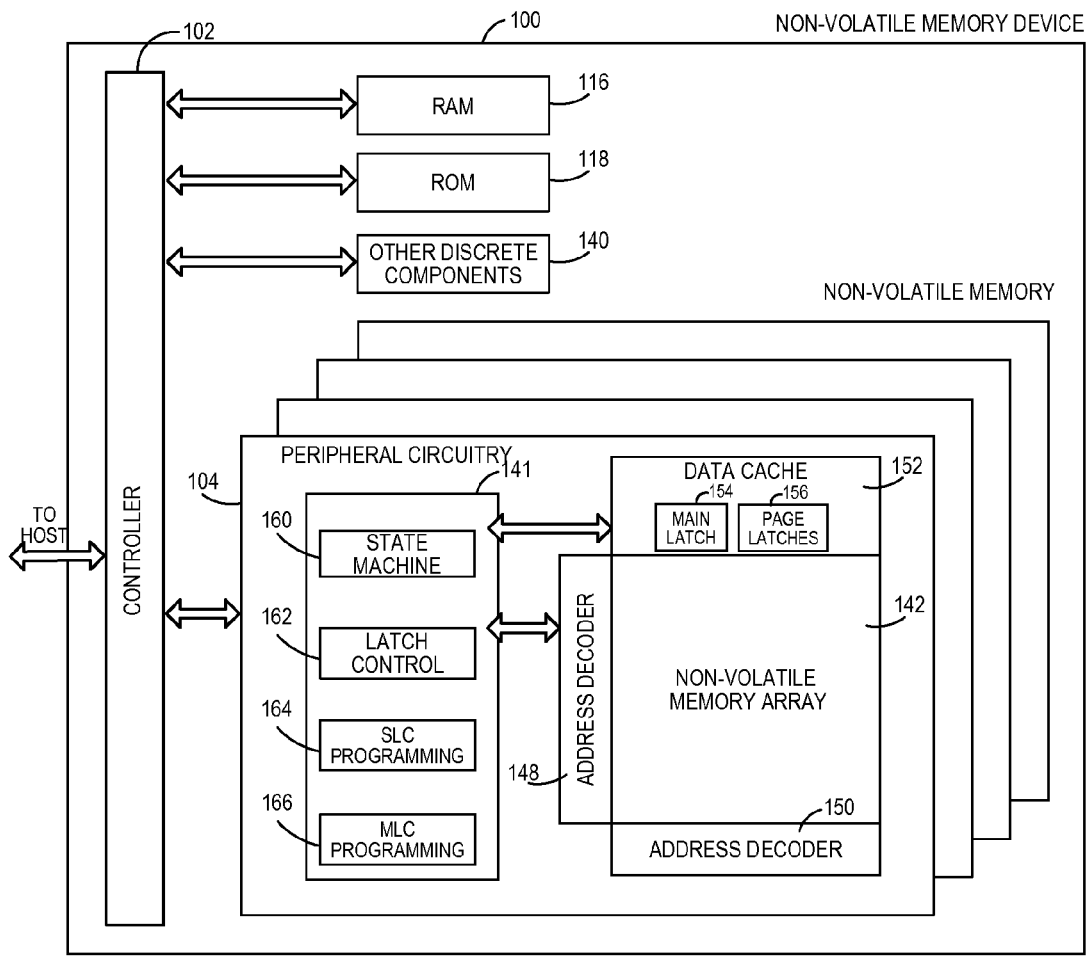
FIG. 2B is a block diagram illustrating exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 160 that provides status information to controller 102, latch control circuitry 162, SLC programming circuitry 164, and MLC programming circuitry 166.

Non-volatile memory die 104 further includes address decoders 148, 150 for addressing within non-volatile memory array 142, and data cache 152. Data cache 152 may include one or multiple sets of latches. Examples of latches include, but are not limited to main latch 154 and page latches 156. In one embodiment, one, some, or all of the latches in data cache 152 may be a page in width. Further, a plurality of sets of data latches may be included in the data cache 152. For example, for a non-volatile memory array 142 arranged to store n bits per page, each set of data latches may include n data latches where each data latch can store 1 bit of data.

In one implementation, an individual data latch may be a circuit that has two stable states and can store 1 bit of data, such as a set/reset, or SR, latch constructed from NAND gates. The data latches 158 may function as a type of volatile memory that only retains data while powered on. Any of a number of known types of data latch circuits may be used for the data latches in each set of data latches. Each non-volatile memory die 104 may have its own sets of data latches and a non-volatile memory array 142.

Latch control circuitry 162 is configured to control the flow of data to one or more of the latches. As discussed in more detail below, DMA 112 may be used to control the movement of data from RAM 116 (such as buffer RAM) to one or more latches, such as main latch 154. In one embodiment, latch control circuitry 162 may be used to control movement of data from main latch 154 to one or more page latches 156. In the example of TLC, latch control circuitry 162 may be used to control movement of data from main latch 154 to lower page latches, middle page latches and upper page latches. In this regard, page latches 156 may include latches for different pages, such as for TLC, lower page latches, middle page latches and upper page latches. Further, though latch control circuitry 162 is illustrated in FIG. 2B as being within non-volatile memory 104, in an alternate embodiment, latch control circuitry 162 may be external to non-volatile memory 104 and may be within controller 102 or in another portion of the memory device. Likewise, though latches in data cache 152 are illustrated in FIG. 2B as being within non-volatile memory 104, in an alternate embodiment, latches 152 may be external to non-volatile memory 104 and may be within controller 102 or in another portion of the memory device.

Peripheral circuitry 141 further includes SLC programming circuitry 164 and MLC programming circuitry 166. SLC programming circuitry 164 includes functionality in order to program data into SLC memory. For example, in one embodiment, data may be programmed from main latch 158 to SLC memory within non-volatile memory array 142, as discussed in more detail below.

Likewise, MLC programming circuitry 166 includes functionality in order to program data into MLC memory. As discussed in more detail below, MLC programming circuitry 166 may include MLC first programming circuitry and MLC reprogramming circuitry (used in response to determining there was an error in programming the MLC). For example, in one embodiment, data may be programmed from page latches 160 to MLC memory within non-volatile memory array 142. Further, in the event of an error in programming of MLC (which may be identified using MLC programming error determination circuitry configured to determine that there is an error in programming the MLC non-volatile memory), MLC programming circuitry 166, using the MLC reprogramming functionality, may access SLC in order to access lost data due to the error event. Though SLC programming circuitry 164 and MLC programming circuitry 166 are illustrated in FIG. 2B as being within non-volatile memory 104, in an alternate embodiment, one or both of SLC programming circuitry 164 and MLC programming circuitry 166 may be external to non-volatile memory 104 and may be within controller 102 or in another portion of the memory device.

As discussed above, the memory device may receive host data from the host device. In one embodiment, the memory device may interface with another electrical device via a physical layer, such as physical layer interface (PHY) 122 that provides the electrical interface with the host device or next level storage controller. Via the PHY 122, the memory device may receive data, such as host data, to write to non-volatile memory. Upon receipt of the data, the memory device may store the data into RAM 116, such as buffer RAM (BRAM). After which, DMA 112 (or other control device) may control the transfer of the data stored in BRAM to another memory, such as volatile memory (e.g., latches). After which, data in the main latch may be transferred to SLC memory for storage and to other memory (such as lower/middle/upper page latches) for programming to MLC memory.

Figure 3:
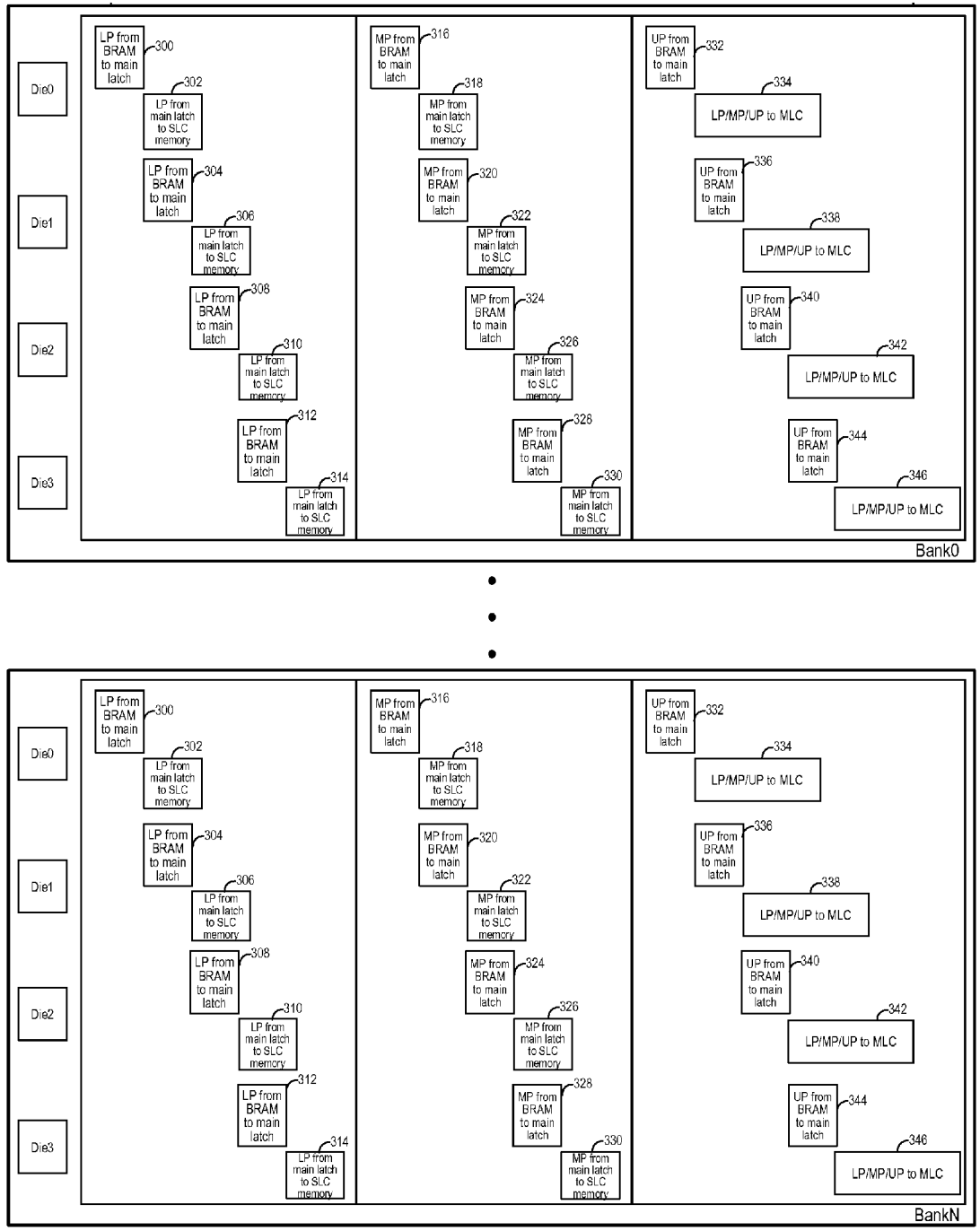
FIG. 3 illustrates a transfer of data within different banks of memory.
Figure 4:
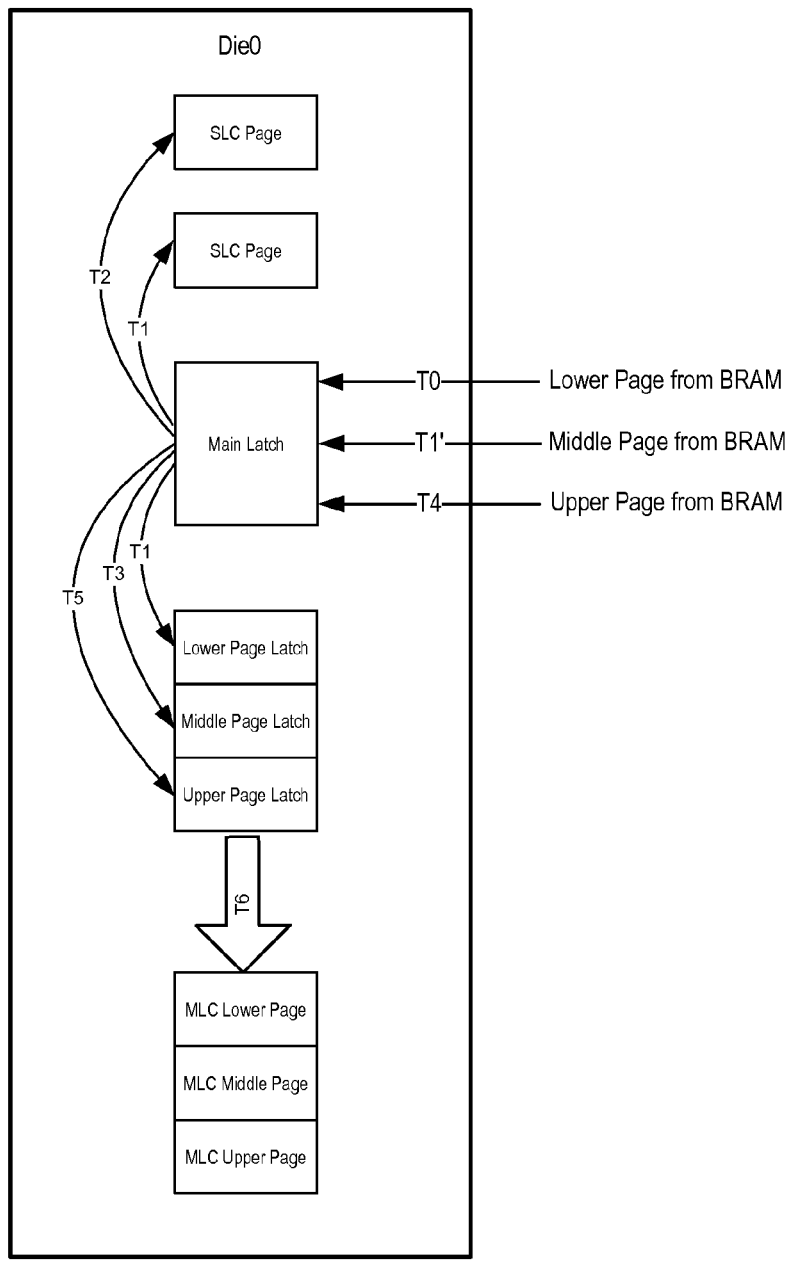
FIG. 4 illustrates a transfer of data within different die of memory.

FIG. 3 illustrates a transfer of data within different banks of memory from BRAM to the main latch, from the main latch to SLC memory, and from the lower/middle/upper page latches to MLC memory. The transfer of the data from BRAM to the lower/middle/upper page latches is illustrated in FIG. 4. In one embodiment, the memory device may include a single bank. In an alternate embodiment, the memory device may include multiple banks, such as Bank0 to BankN, as illustrated in FIG. 3. Any number of banks are contemplated. Further, in one embodiment, there may be a single die within a bank. In an alternate embodiment, there may be multiple die within a bank. For example, FIG. 3 illustrates 4 die (Die0, Die1, Die2, Die3). However, fewer or greater number of die within a bank are contemplated.

As illustrated in FIG. 3, the memory device may program the banks in parallel. Further, in one embodiment, within a bank, the dies may be programmed serially. FIG. 3 illustrates the programming of TLC memory, whereby a lower page, a middle page, and an upper page is programmed. FIG. 3 is merely for illustration purposes, with programming of different MLC memory, such as DLC, QLC, or the like, being contemplated.

Within bank 0, at 300, for Die0, DMA 112 controls the movement of the lower page of data (LP) from BRAM to the main latch 158. After the transfer at 300, at 302, the lower page from the main latch is programmed into SLC memory in Die0. Further, after the transfer at 300, at 304, DMA 112 controls the movement of the lower page of data (LP) from BRAM to the main latch 158 for Die1. In this regard, when the DMA 112 is finished with the transfer of the data from BRAM to the main latch for one die, the DMA 112 may begin the transfer of the data from BRAM to the main latch for another die. FIG. 3 illustrates at 300, 304, 308, and 312, the DMA 112 transfer of the lower page to the main latch of each of Die0, Die1, Die2, and Die3. Similarly, 302, 306, 310, and 314 illustrates the lower page from the main latch is programmed into SLC memory in each of Die0, Die1, Die2, and Die3.

The memory device may send to the host device the acknowledgment of the lower page of data in response to one of several events. In one embodiment, the acknowledgment may be sent in response to the programming of the data in non-volatile memory. For example, in response to confirmation that the SLC memory has been programmed with the lower pages, the memory device may send an acknowledgement to the host device of the lower pages. In one embodiment, after confirmation that a single lower page has been programmed in SLC memory, the memory device may send the acknowledgement. Alternatively, the memory device may send the acknowledgment after confirmation that the lower pages have been programmed in multiple dies, such as in Die0, Die1, Die2, and Die3. In an alternative embodiment, the memory device sends the acknowledgment to the host device in response to the data being transferred from the main latch to another volatile memory, such as the lower page latches, as discussed in more detail below. FIG. 3 does not illustrate the transfer of data from main latch 158 to one of page latches 160. Instead, FIG. 4 illustrates this transfer, as discussed in more detail below.

After the DMA 112 controls the transfer of lower page of data to the main latch in Die3 at 312, the DMA begins the transfer of the middle pages of data (illustrated in the middle panel of FIG. 3). Thus, similar to the transfer for the lower page, at 316, 320, 324, 328, the DMA serially controls the transfer from BRAM to the main latch for the middle pages of data. Likewise, after the transfer of the middle page from BRAM into the main latch for a respective die, the middle page in the main latch is programmed into SLC memory, as illustrated in 318, 322, 326, 330.

Similar to the lower page, the memory device may send to the host device the acknowledgment of the middle page of data in response to one of several events. In one embodiment, the acknowledgment may be sent in response to the programming of the data in non-volatile memory (e.g., the programming of the middle page in SLC memory). In an alternative embodiment, the memory device sends the acknowledgment to the host device in response to the data being transferred from the main latch to the middle page latches, as discussed in more detail below.

After the DMA 112 controls the transfer of middle page of data to the main latch in Die3 at 328, the DMA begins the transfer of the upper pages of data (illustrated in the right panel of FIG. 3). Thus, similar to the transfer for the lower page and the middle page, at 332, 336, 340, 344, the DMA serially controls the transfer from BRAM to the main latch for the upper pages of data. However, unlike the left and middle panels in FIG. 3, the right panel does not transfer the upper page of data to SLC memory. Instead, at 334, 338, 342, 346, the MLC is programmed using the lower/middle/upper page latches. Programming of the MLC memory may take on the order of 1.8 to 2 milliseconds. This is unlike the programming of the SLC memory, which may take 400-500 microseconds.

The memory device may send to the host device the acknowledgment of the upper page of data in response to one of several events. In one embodiment, the acknowledgment may be sent in response to the programming of the data in non-volatile memory (e.g., the completion of programming of the MLC memory). However, during the time that the MLC memory is being programmed (and before the acknowledgement for the upper page of data has been sent to the host device), an error event may occur in which the MLC memory is not programmed properly or completely. In this instance, the program for the MLC memory may be restarted, using the previously acknowledged data stored in SLC memory (such as the lower page and middle page) and requesting the host device to resend the unacknowledged data (such as a remainder of the data not acknowledged (e.g., the upper page)), as discussed in more detail in FIG. 5. In response to sending the request to resend the unacknowledged data, the host device resends the unacknowledged data (e.g., the upper page). Further, in response to the memory device receiving the unacknowledged data again, the memory device may load the unacknowledged data into the page latches, load the acknowledged data (stored in SLC memory) into the page latches, and then perform a second programming of the MLC memory (e.g., use reprogramming circuitry to perform the second programming of the MLC memory).

FIG. 4 illustrates a transfer of data within different die of memory. In particular, FIG. 4 illustrates the timing amongst the various circuit elements within a die of memory. FIG. 4 illustrates the transfer of data within a single die (Die0). However, in an alternate embodiment, multiple die (such as depicted in FIG. 3) may be used. Further, FIG. 4 illustrates the programming of TLC memory, whereby a lower page, a middle page, and an upper page is programmed. FIG. 4 is merely for illustration purposes, with programming of different MLC memory, such as DLC, QLC, or the like, being contemplated.

At time 0 (T0), the lower page of data is sent from BRAM into main latch. In one embodiment, the sending of the lower page of data from BRAM into main latch takes approximately 100-120 microseconds. At time 1 (T1), the lower page of data is programmed into an SLC page and the lower page of data is transferred from the main latch to the lower page latch. In one embodiment, the lower page of data is transferred from the main latch to the lower page latch in approximately 10 microseconds. Further, in one embodiment, programming of the lower page of data into SLC memory may take approximately 400-500 microseconds. Thus, as illustrated in FIG. 4, the programming of the lower page of data into SLC memory and the transfer of lower page of data into the lower page latch is performed at least partly simultaneously. At T1' (after the transfer of the lower page from the main latch into the lower page latch), the middle page of data is sent from BRAM into main latch. In one embodiment, the time to transfer the middle page of data from BRAM into main latch is 100-120 microseconds, similar to transfer time from BRAM into the main latch for the lower page of data. In this regard, the transfer of the middle page of data from BRAM into the main latch may be completed before the lower page of data is programmed into SLC.

At time 2 (T2), the middle page of data is programmed into an SLC page. At time 3 (T3), the middle page of data is transferred from the main latch to the middle page latch. Thus, as illustrated in FIG. 4, the programming of the lower page of data into SLC memory and the transfer of lower page of data into the lower page latch is performed serially.

At time 4 (T4), the upper page of data is transferred from BRAM into the main latch. At time 5 (T5), the upper page of data is transferred from the main latch to the middle page latch. Of note, the upper page of data is not programmed into SLC memory. At time 6 (T6), the data in the lower/middle/upper latches is programmed into the MLC lower/middle/upper pages. In one embodiment, the time for programming the data in the lower/middle/upper latches is programmed into the MLC lower/middle/upper pages is 1.8-2 milliseconds. One type of programming of the MLC is by using a first-foggy-fine, such as illustrated in U.S. Pat. No. 8,811,091, incorporated by reference herein in its entirety.

Figure 5:
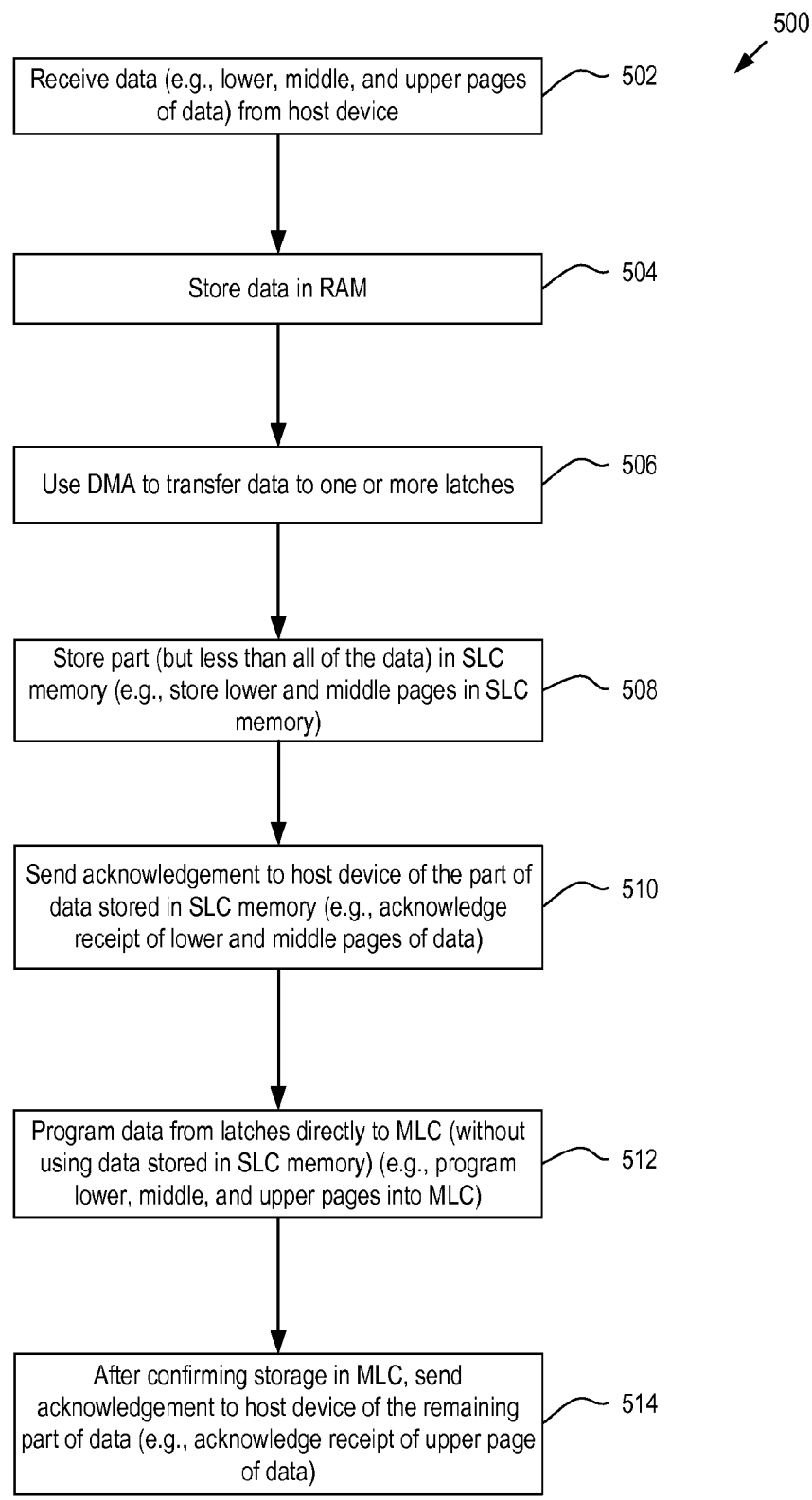
FIG. 5 illustrates a first flow chart for direct writing to MLC memory.

FIG. 5 illustrates a first flow chart 500 for direct writing to MLC memory. At 502, the data is received from the host device. Examples of the data include lower, middle and upper pages of data. At 504, the data is stored in volatile memory, such as RAM. The data may optionally be transferred to another volatile memory. For example, at 506, a DMA may be used to transfer the data from the volatile memory to one or more latches. As discussed above, the latches may include a main latch and one or more page latches (such as lower/middle/upper page latches). Further, the lower/middle/upper pages may be transferred from BRAM into the main latch.

At 508, part, but less than all, of the data may be stored in non-volatile memory, such as SLC memory. For example, the lower and middle pages stored in the main latch may be saved in SLC memory. Further, at 510, an acknowledgement of receipt of the data that was stored in SLC memory may be sent to the host. For example, the memory device may send an acknowledgement to the host device indicating receipt of the data corresponding to the lower and middle pages stored in SLC memory. At 512, the MLC memory is programmed using data from the latches without accessing the data stored in SLC memory. For example, the lower/middle/upper pages may be transferred from the main latch to the lower/middle/upper page latches, respectively. Further, the lower/middle/upper page latches may be used to program MLC lower/middle/upper page.

Figure 6:
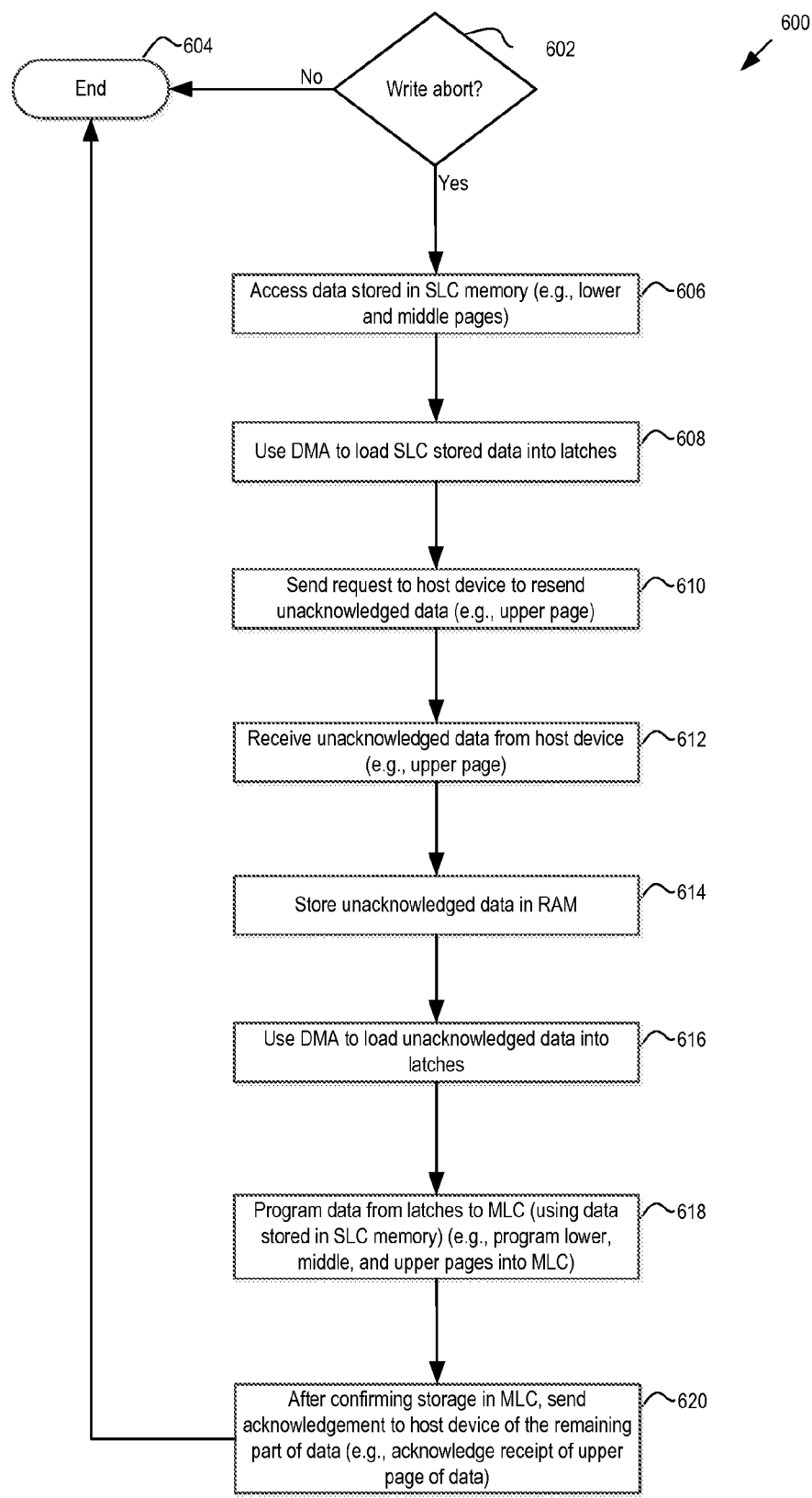
FIG. 6 illustrates a second flow chart for direct writing to MLC memory.

FIG. 6 illustrates a second flow chart 600 for direct writing to MLC memory. At 602, the memory device determines whether a write abort has occurred. For example, the memory device may determine that that there was an error in programming the MLC memory. In particular, upon the memory device performing the initialization sequence upon power-up, the memory device can scan the wordline in MLC memory to determine that the wordline is not completely written. In response to this determination, the memory device may use the data in SLC memory (such as the lower and middle pages), and request the upper page from the host device in order to program the MLC memory.

In response to determining that a write abort has occurred, at 606, data stored in SLC memory is accessed. For example, the lower and middle pages are accessed from SLC memory. At 608, the DMA is used to load the SLC stored data into latches (such as lower/middle page latches). At 610, the memory device sends a communication to the host device requesting the host device to send the unacknowledged data. In response to the request, at 612, the memory device receives the unacknowledged data from the host device. In the example of TLC memory, the memory device receives the upper page of data. At 614, the unacknowledged data is stored in volatile memory (such as BRAM). At 616, the DMA is used to load the unacknowledged data into one or more latches (such as into the main latch, and then into the upper page latches). At 618, MLC memory is programmed with the data from the latches. In this regard, the MLC memory is programmed using data transferred from SLC memory. At 620, after confirming the programming of the MLC memory, the memory device sends an acknowledgement to the host device regarding the unacknowledged data.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In one embodiment, a module may be used and may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Further, the methods, devices, processing, circuitry, and logic described herein may be implemented in many different ways and in many different combinations of hardware and software. For example, all or parts of the implementations may be circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and managed, may be incorporated into a single memory or database, may be logically and physically organized in many different ways, and may be implemented in many different ways. Example implementations include linked lists, program variables, hash tables, arrays, records (e.g., database records), objects, and implicit storage mechanisms. Instructions may form parts (e.g., subroutines or other code sections) of a single program, may form multiple separate programs, may be distributed across multiple memories and processors, and may be implemented in many different ways. Example implementations include stand-alone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

Thus, associated circuitry may be used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for programming non-volatile memory in a memory device, a first part of the non-volatile memory configured as single-level cell (SLC) non-volatile memory and a second part of the non-volatile memory is configured as multi-level cell (MLC) non-volatile memory, the method comprising:
    receiving data from a host device;
    storing the data in one or more volatile memory;
    storing part but not all of the data in the SLC non-volatile memory, wherein the data received from the host device comprises the part of the data stored in the SLC non-volatile memory and a remainder;
    storing, using the data stored in the one or more volatile memory, the data in MLC non-volatile memory without transfer of the part of the data stored in SLC non-volatile memory from the SLC non-volatile memory;
    determining whether there is an error in storing at least some of the data in the MLC non-volatile memory;
    in response to determining that there is an error in storing at least some of the data in the MLC non-volatile memory:
        requesting the host device to resend the remainder of the data;
        receiving the remainder of the data from the host device; and
        using at least a portion of the part of the data stored in the SLC non-volatile memory and the remainder of the data received from the host device to program the MLC non-volatile memory.

2. The method of claim 1, wherein storing the data in one or more volatile memory comprises storing the data in buffer random access memory (BRAM).

3. The method of claim 1, wherein the memory device further comprises one or more latches; and
    wherein storing the data in one or more volatile memory comprises storing the data into the one or more latches.

4. The method of claim 3, wherein storing part of the data in the SLC non-volatile memory comprises programming the SLC non-volatile memory using the data stored in the one or more latches; and
    wherein the part of the data stored in the SLC non-volatile memory is used to program the MLC non-volatile memory only in response to determining the error in programming the MLC non-volatile memory.

5. The method of claim 1,
    wherein using at least the portion of the part of the data stored in the SLC non-volatile memory comprises:
        transferring the part of the data in the SLC non-volatile memory to the one or more volatile memory; and
        using the part of the data transferred from the SLC non-volatile memory to the one or more volatile memory in order to program the MLC non-volatile memory.

6. A method for programming non-volatile memory in a memory device, a first part of the non-volatile memory configured as single-level cell (SLC) non-volatile memory and a second part of the non-volatile memory is configured as multi-level cell (MLC) non-volatile memory, the method comprising:
    receiving data from a host device;
    storing the data in one or more volatile memory;
    storing part or all of the data in the SLC non-volatile memory;
    storing, using the data stored in the one or more volatile memory, the data in MLC non-volatile memory without transfer of the part or all of the data stored in SLC non-volatile memory from the SLC non-volatile memory; and
    sending, by the memory device, an acknowledgement of receipt of the part of the data programmed in the SLC non-volatile memory, the sending of the acknowledgement being performed prior to completion of programming the data in the MLC non-volatile memory.

7. The method of claim 6, wherein storing the part or all of the data in the SLC non-volatile memory comprises programming a part, but less than all, of the data programmed in the MLC non-volatile memory into the SLC non-volatile memory;
    wherein the data received from the host device comprises the part of the data programmed in the SLC non-volatile memory and a remainder; and
    in response to determining that there is an error in storing the data in MLC non-volatile memory, further comprising sending, by the memory device, a request to the host device to resend the remainder of the data.

8. The method of claim 7, further comprising:
    responsive to the request for the remainder of the data, receiving, from the host device, the remainder of the data; and
    storing the remainder of the data in the one or more volatile memory, wherein using the part or all of the data transferred from the SLC non-volatile memory to the one or more volatile memory in order to program the MLC non-volatile memory comprises:
    using the part of the data transferred from the SLC non-volatile memory to the one or more volatile memory and the remainder of the data stored in the one or more volatile memory in order to program the MLC non-volatile memory.

9. A memory device comprising:
    one or more volatile memory;
    non-volatile memory, wherein a first part of the non-volatile memory is configured as single-level cell (SLC) non-volatile memory and a second part of the non-volatile memory is configured as multi-level cell (MLC) non-volatile memory;
    programming circuitry configured to program at least a part of data into SLC non-volatile memory;

transfer circuitry configured to transfer the data into the one or more volatile memory;

programming circuitry configured to program the data from the one or more volatile memory into MLC non-volatile memory without transfer of the at least a part of the data stored in SLC non-volatile memory from the SLC non-volatile memory; and acknowledgement circuitry configured to send, in response to programming of less than all of the data into the SLC non-volatile memory, an acknowledgement to a host device of receipt of the less than all of the data.

10. The memory device of claim 9, wherein the one or more volatile memory comprises buffer random access memory (BRAM) and one or more latches; and wherein the transfer circuitry comprises direct memory access circuitry configured to transfer the data from the BRAM to the one or more latches.

11. The memory device of claim 9, wherein the programming circuitry is configured to program less than all of the data into the SLC non-volatile memory.

12. The memory device of claim 9, further comprising MLC programming error determination circuitry configured to determine that there is an error in programming the MLC non-volatile memory; and MLC reprogramming circuitry configured, in response to determining that there is an error in programming the MLC non-volatile memory, to use the at least a part of the data stored in the SLC non-volatile memory to program the MLC non-volatile memory.

13. The memory device of claim 12, wherein the data is received from the host device, the data comprises a plurality of pages;

wherein less than all of the pages are stored in the SLC memory; and wherein all of the pages are stored in MLC memory.

14. The memory device of claim 12, the data comprises a first set of pages and a second set of pages;

wherein the first set of pages are stored in the SLC non-volatile memory;

wherein the second set of pages are not stored in the SLC non-volatile memory; and wherein both the first set of pages and the second set of pages are stored in the MLC non-volatile memory.

15. The memory device of claim 14, wherein the acknowledgement circuitry is configured to send, in response to programming of the first set of pages into the SLC non-volatile memory, the acknowledgement to the host device of receipt of the first set of pages of memory; and further comprising request resend circuitry configured to, in response to determining that there is an error in programming the MLC non-volatile memory, request resending of the second set of pages.

16. The memory device of claim 15, wherein the acknowledgement circuitry is further configured to send, in response to programming of the data into the MLC non-volatile memory, acknowledgement of the second set of pages.

17. A method for programming non-volatile memory in a memory device, a first part of the non-volatile memory configured as single-level cell (SLC) non-volatile memory and a second part of the non-volatile memory is configured as multi-level cell (MLC) non-volatile memory, the method comprising:

receiving data from a host device;

storing the data in one or more volatile memory;

storing part or all of the data in single-level cell (SLC) non-volatile memory;

performing a first programming of the MLC non-volatile memory using the data stored in one or more volatile memory without using the data stored in the SLC non-volatile memory;

determining whether there is an error in the first programming of the MLC non-volatile memory; and in response to determining that there is an error in the first programming of the MLC non-volatile memory, performing a second programming of the MLC non-volatile memory using part or all of the data stored in the SLC non-volatile memory, wherein storing of at least a portion of the data in the SLC non-volatile memory is performed at least partly simultaneously with the storing of the at least a portion of the data in the volatile memory.

18. The method of claim 17, wherein the one or more volatile memory comprises a plurality of page latches; and wherein storing the data in the one or more volatile memory comprises storing the data in the plurality of page latches.

19. The method of claim 18, wherein the data comprises a plurality of pages;

wherein storing part or all of the data in the SLC non-volatile memory comprises storing less than all of the plurality of pages; and wherein performing the first programming of the MLC non-volatile memory comprises programming all of the plurality of pages.

20. The method of claim 19, wherein the data comprises a lower page, a middle page and an upper page;

wherein storing part or all of the data in the SLC non-volatile memory comprises storing the lower page and the middle page in the SLC non-volatile memory, but not storing the upper page in the SLC non-volatile memory; and wherein performing the first programming of the MLC non-volatile memory comprises programming the lower, middle and upper pages into the MLC non-volatile memory.

21. The method of claim 20, wherein storing the lower page in the SLC non-volatile memory is performed at least partly simultaneously with the storing of the lower page in the page latches; and wherein storing the middle page in the SLC non-volatile memory is not performed at least partly simultaneously with the storing of the middle page in the page latches.

* * * * *